US008653899B2

United States Patent
Aratake

(10) Patent No.: US 8,653,899 B2
(45) Date of Patent: Feb. 18, 2014

(54) PIEZOELECTRIC VIBRATOR, OSCILLATOR, ELECTRONIC DEVICE AND RADIO TIMEPIECE

(75) Inventor: Kiyoshi Aratake, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 10 days.

(21) Appl. No.: 13/398,350

(22) Filed: Feb. 16, 2012

(65) Prior Publication Data

US 2012/0224460 A1    Sep. 6, 2012

(30) Foreign Application Priority Data

| Mar. 1, 2011 | (JP) | 2011-044291 |
| Mar. 1, 2011 | (JP) | 2011-044292 |
| Mar. 10, 2011 | (JP) | 2011-053146 |
| Mar. 13, 2011 | (JP) | 2011-054900 |
| Dec. 1, 2011 | (JP) | 2011-263937 |

(51) Int. Cl.
   *H03B 5/30* (2006.01)
(52) U.S. Cl.
   USPC .......................................... 331/156; 310/370

(58) Field of Classification Search
   USPC .......................................... 331/156; 310/370
   See application file for complete search history.

(56) References Cited

U.S. PATENT DOCUMENTS 6,897,737 B2 *   5/2005   Sakata et al. .................. 331/156

FOREIGN PATENT DOCUMENTS

| JP | 07-074581 | 3/1995 |
| JP | 2003-110398 | 4/2003 |

* cited by examiner

*Primary Examiner* — Joseph Chang
(74) *Attorney, Agent, or Firm* — Brinks Gilson & Lione

(57) ABSTRACT

A piezoelectric vibrator, an oscillator, an electronic device and a ratio timepiece are provided which are capable of increasing a capacitance C0 while achieving miniaturization and cost reduction. The piezoelectric vibrator includes a base substrate, a lid substrate, a piezoelectric vibrating reed on which an excitation electrode is formed, and external electrodes. An electrode pattern for capacitance adjustment, which extends along a routing electrode, is provided extending from a routing electrode.

9 Claims, 16 Drawing Sheets

PIEZOELECTRIC VIBRATOR, OSCILLATOR, ELECTRONIC DEVICE AND RADIO TIMEPIECE

RELATED APPLICATIONS

This application claims priority under 35 U.S.C. §119 to Japanese Patent Application Nos. 2011-044291 filed on Mar. 1, 2011, 2011-044292 filed on Mar. 1, 2011, 2011-053146 filed on Mar. 10, 2011, 2011-054900 filed on Mar. 13, 2011, and 2011-263937 filed on Dec. 1, 2011, the entire contents of which are hereby incorporated by reference.

BACKGROUND OF THE INVENTION

1. Field of the Invention

The present invention relates to a circuit for providing a crystal oscillator circuit with low power consumption, and particularly relates to an oscillator circuit including an amplifier circuit and an electronic apparatus including the oscillator circuit.

The present invention relates to a piezoelectric vibrator in which a piezoelectric vibrating reed is housed in a cavity formed between two substrates that are bonded to each other, an oscillator, an electronic device and a radio timepiece.

2. Description of the Related Art

In recent years, mobile telephones and portable information terminal devices employ a piezoelectric vibrator that uses crystal or the like as a time source, a timing source of control signals or the like, and a reference signal source etc. For example, a piezoelectric vibrator is known which includes a base substrate and a lid substrate that are bonded to each other, and which houses a piezoelectric vibrating reed in a recessed portion for a cavity that is formed between the base substrate and the lid substrate.

In this type of piezoelectric vibrator, the piezoelectric vibrating reed is vibrated at a predetermined frequency by applying a predetermined voltage from external electrodes to an excitation electrode formed on the piezoelectric vibrating reed. More specifically, an electrode pattern that electrically connects the excitation electrode and the external electrodes is formed on the base substrate, and a voltage is applied from the external electrodes to the piezoelectric vibrating reed via the electrode pattern. Note that related art is disclosed in JP-A-2003-110398 and JP-A-7-74581.

SUMMARY OF THE INVENTION

However, the above-described known piezoelectric vibrator has a following problem. Generally, "varying characteristics" are known as an indicator of characteristics of a piezoelectric vibrator. The varying characteristics are characteristics that indicate how a frequency variation ($\Delta f/f$) changes when the value of load capacitance (CL) of the piezoelectric vibrator is changed. Generally, the smaller the value of the load capacitance (CL), the larger the frequency variation ($\Delta f/f$). However, it is preferable that the frequency variation ($\Delta f/f$) is as small as possible.

To address this, as a method to suppress the frequency variation ($\Delta f/f$) of the piezoelectric vibrator, it is conceivable that a capacitance C0 of the piezoelectric vibrator is increased. Here, the capacitance C0 indicates the capacitance of the piezoelectric vibrator itself. More specifically, if the capacitance C0 of the piezoelectric vibrator itself is increased, it is possible to suppress the above-described frequency variation ($\Delta f/f$) to a low value. Further, it is possible to improve electrical characteristics of the piezoelectric vibrator. However, in recent years, a demand for miniaturization of the piezoelectric vibrator is increasing more and more. If a structural component is separately provided in order to increase the capacitance C0, it is difficult to achieve the demand for miniaturization. Further, this also leads to an increase in manufacturing costs.

In this way, in the related art, there is no disclosed technology that increases the capacitance C0 of the piezoelectric vibrator itself while achieving miniaturization and cost reduction of the piezoelectric vibrator. In light of the foregoing, the present disclosure provides a piezoelectric vibrator, an oscillator, an electronic device and a radio timepiece that are capable of increasing a capacitance C0 while achieving miniaturization and cost reduction.

In order to solve the above-described problem, according to an aspect of the invention, there is provided a piezoelectric vibrator that includes: a base substrate; a lid substrate that is joined to the base substrate in a state in which the lid substrate faces the base substrate; a piezoelectric vibrating reed which is housed in a recessed portion formed between the base substrate and the lid substrate, and on which an excitation electrode is formed; external electrodes formed on an outer surface of the base substrate; and electrode patterns that electrically connect the piezoelectric vibrating reed and the external electrodes. In the piezoelectric vibrator, the external electrodes and the electrode patterns are provided corresponding to respective electrical polarities. The electrode pattern corresponding to one of the polarities and the electrode pattern corresponding to the other of the polarities closely face each other on an inner surface side of the base substrate.

According to another aspect of the invention, there is provided a piezoelectric vibrator that includes: a base substrate; a lid substrate that is joined to the base substrate in a state in which the lid substrate faces the base substrate; a piezoelectric vibrating reed which is housed in a recessed portion formed between the base substrate and the lid substrate, and on which an excitation electrode is formed; external electrodes formed on an outer surface of the base substrate; and electrode patterns that electrically connect the piezoelectric vibrating reed and the external electrodes. In the piezoelectric vibrator, the external electrodes and the electrode patterns are provided corresponding to respective electrical polarities. The electrode pattern corresponding to one of the polarities and the external electrode corresponding to the other of the polarities face each other in a thickness direction of the base substrate.

It is preferable that an electrode pattern for capacitance adjustment, which extends along the electrode pattern corresponding to the one of the polarities, is extended from the electrode pattern corresponding to the other of the polarities such that the electrode pattern corresponding to the one of the polarities and the electrode pattern corresponding to the other of the polarities closely face each other.

Further, it is preferable that a first overlapping electrode portion, which extends from the electrode pattern corresponding to the one of the polarities, and a second overlapping electrode portion, which extends from the electrode pattern corresponding to the other of the polarities, closely face each other with a dielectric substance interposed between the first and the second overlapping electrode portions.

Further, it is preferable that the electrode pattern corresponding to the one of the polarities is formed on an inner surface side of the base substrate such that the electrode pattern extends to a region facing the external electrode corresponding to the other of the polarities.

Further, it is preferable that the base substrate is a ceramic multilayer substrate that is formed by stacking a plurality of ceramic sheets in a thickness direction, and that an extended portion for facing the external electrode is formed on at least one of the plurality of ceramic sheets, from the electrode pattern corresponding to the one of the polarities, such that the extended portion faces the external electrode corresponding to the other of the polarities.

Moreover, it is preferable that the lid substrate is a substrate made of a glass material and a weight metal film for frequency adjustment is formed on a tip end of the piezoelectric vibrating reed, and that the electrode patterns are not formed in a vicinity of the tip end of the piezoelectric vibrating reed, on the inner surface side of the base substrate.

It is preferable that the above-described piezoelectric vibrator is electrically mounted on an integrated circuit, as an oscillation element.

It is preferable that the above-described piezoelectric vibrator is electrically mounted on a time measuring portion.

It is preferable that the above-described piezoelectric vibrator is electrically connected to a filter portion.

As explained above, according to the invention, it is possible to provide a piezoelectric vibrator, an oscillator, an electronic device and a radio timepiece that are capable of increasing a capacitance C0 while achieving miniaturization and cost reduction.

DETAILED DESCRIPTION OF THE PREFERRED EMBODIMENTS

Hereinafter, exemplary embodiments of the invention will be explained in detail with reference to the appended drawings. Note that, dimensions, materials and shapes of structural components described in the embodiments below and relative layouts of the structural components are merely examples, and they are not intended to limit the scope of the invention to only these examples, except as otherwise described herein.

First Embodiment

A first embodiment of the invention will be explained with reference to FIG. 1 to FIG. 6.

1-1: Schematic Structure of Piezoelectric Vibrator

Figure 1:
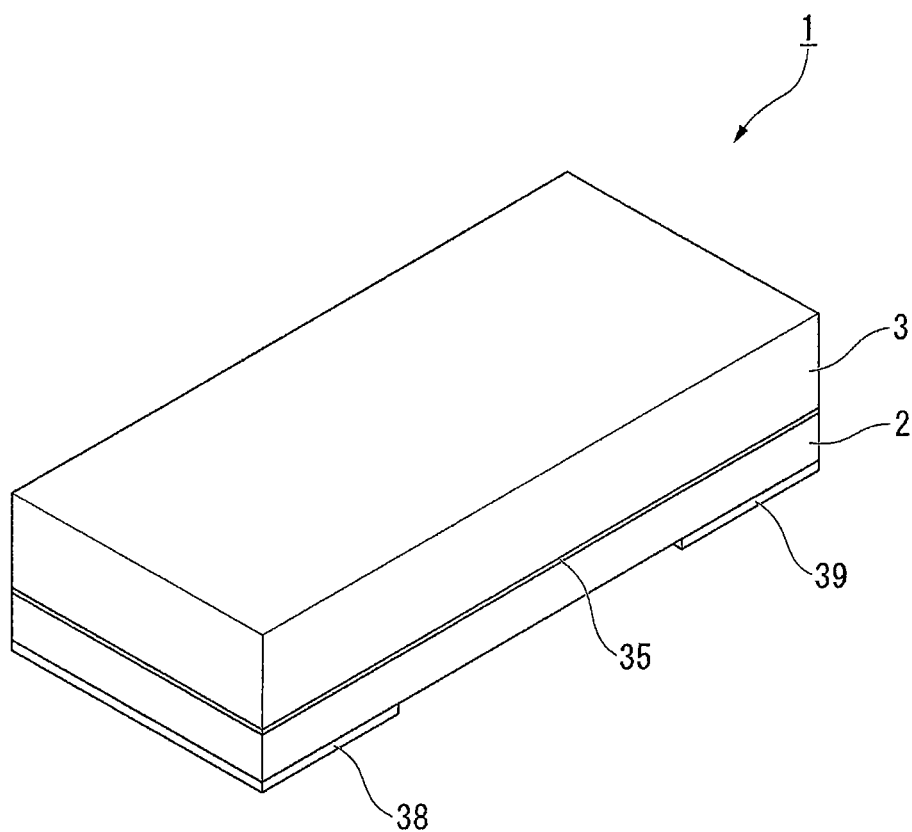
FIG. 1 is a perspective view of a piezoelectric vibrator according to the invention.

A schematic structure of a piezoelectric vibrator 1 according to the present embodiment will be explained with reference to FIG. 1 to FIG. 4. The piezoelectric vibrator 1 according to the present embodiment is provided with a base substrate 2, and a lid substrate 3 in which a cavity recessed portion is formed. A piezoelectric vibrating reed 4 is housed in the cavity recessed portion in a state in which the both substrates are bonded to each other. As shown in FIG. 1, the piezoelectric vibrator 1 is formed to have a box shape in a state in which the both substrates are bonded together. Note that the cavity recessed portion may be formed in the base substrate 2, or may be formed in both the base substrate 2 and the lid substrate 3.

Figure 4:
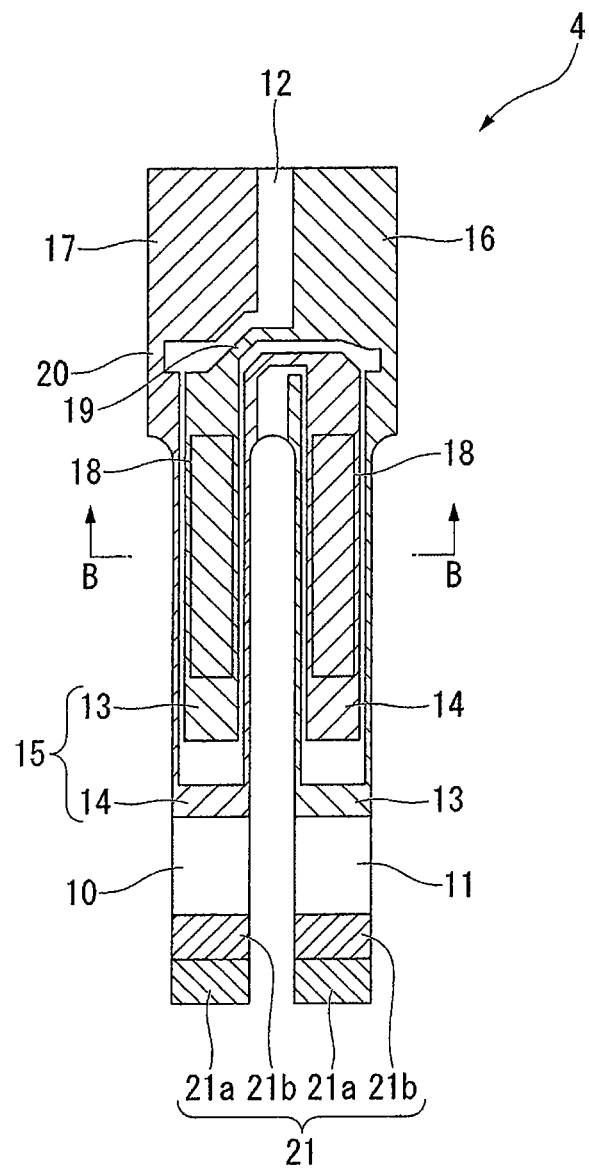
FIG. 4 is a schematic view of a piezoelectric vibrating reed according to the invention.

As shown in FIG. 4, the piezoelectric vibrating reed 4 is a tuning-fork type vibrating reed formed of a piezoelectric material, such as crystal, lithium tantalate, lithium niobate or the like. The piezoelectric vibrating reed 4 vibrates at a predetermined frequency when voltages of positive and negative electrodes are applied, respectively.

The piezoelectric vibrating reed 4 includes: a pair of vibrating arm portions 10 and 11 that are disposed parallel to each other; and a base portion 12 that integrally fixes a base end side of the pair of vibrating arm portions 10 and 11. Further, the piezoelectric vibrating reed 4 includes: an excitation electrode 15 that is formed by a first excitation electrode 13 and a second excitation electrode 14 that are formed on outer surfaces of the pair of vibrating arm portions 10 and 11 and vibrate the pair of vibrating arm portions 10 and 11; and mount electrodes 16 and 17 that are electrically connected to the first excitation electrode 13 and the second excitation electrode 14.

Further, the piezoelectric vibrating reed 4 of the present embodiment includes groove portions 18 that are respectively formed on both principal surfaces of the pair of vibrating arm portions 10 and 11 along a longitudinal direction of the vibrating arm portions 10 and 11. The groove portions 18 are formed from the base end side to substantially the middle of the vibrating arm portions 10 and 11.

The excitation electrode 15, which is formed by the first excitation electrode 13 and the second excitation electrode 14, is an electrode that vibrates the pair of vibrating arm portions 10 and 11 at a predetermined resonance frequency in a direction to move closer to or away from each other. The excitation electrode 15 is formed through patterning on the outer surfaces of the pair of vibrating arm portions 10 and 11 such that the first excitation electrode 13 and the second excitation electrode 14 are in an electrically isolated state. Voltages of positive and negative electrodes are applied to the first and second excitation electrodes 13 and 14.

Further, the first excitation electrode 13 and the second excitation electrode 14 are electrically connected to the mount electrodes 16 and 17 on both principal surfaces of the base portion 12, respectively, via lead-out electrodes 19 and 20. The piezoelectric vibrating reed 4 is adapted to receive a voltage from the outside via the mount electrodes 16 and 17. Note that the excitation electrode 15, the mount electrodes 16 and 17, and the lead-out electrodes 19 and 20 that are described above are formed by coating a conductive film made of, for example, chromium (Cr), nickel (Ni), aluminum (Al), titanium (Ti) or the like.

Further, a weight metal film 21 for frequency adjustment is coated on the tip ends of the pair of vibrating arm portions 10 and 11. The weight metal film 21 includes: a rough adjustment film 21a that is used when the frequency is roughly adjusted; and a fine adjustment film 21b that is used when the frequency is finely adjusted. Frequency adjustment is performed by irradiating a laser beam onto the rough adjustment film 21a and the fine adjustment film 21b so that the frequency of the pair of vibrating arm portions 10 and 11 can fall within a nominal frequency range of a device. Note that, since the lid substrate 3 of the present embodiment is formed of a glass material, the frequency adjustment can be performed by laser beam trimming after the lid substrate 3 and the base substrate 2 are bonded together.

Figure 3:
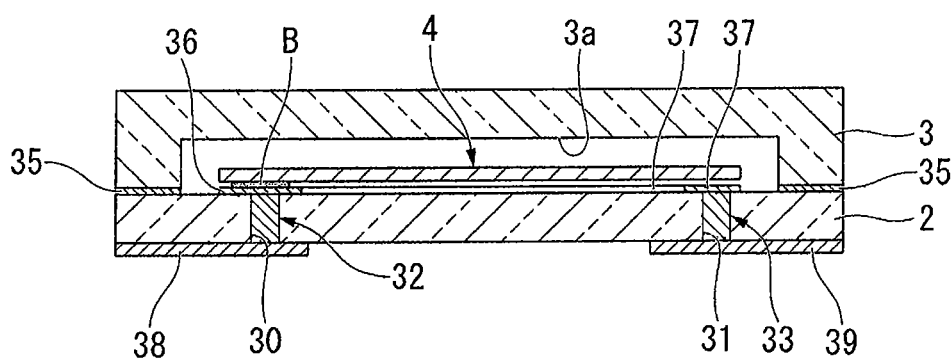
FIG. 3 is a cross-sectional view of the piezoelectric vibrator according to the invention.

The piezoelectric vibrating reed 4 formed in this way is bump bonded to a top surface of the base substrate 2 using metal bumps B (made of Au, for example) as shown in FIG. 3. More specifically, the pair of mount electrodes 16 and 17 are respectively in contact with the two bumps B that are formed on routing electrodes 36 and 37 patterned on an inner surface side (the side on which the piezoelectric vibrating reed 4 is housed) of the base substrate 2. Thus, the piezoelectric vibrating reed 4 is supported in a floating state above the inner surface of the base substrate 2.

The lid substrate 3 is a transparent insulating substrate made of a glass material, such as soda lime glass, for example. A rectangular-shaped recessed portion 3a, in which the piezoelectric vibrating reed 4 is housed, is formed on a bonding surface side of the lid substrate 3, to which the base substrate 2 is bonded. When the base substrate 2 and the lid substrate 3 are overlapped with each other, the recessed portion 3a forms a cavity C that houses the piezoelectric vibrating reed 4. The lid substrate 3 is anodically bonded to the base substrate 2 in a state in which the recessed portion 3a faces the base substrate 2 side.

In a similar way to the lid substrate 3, the base substrate 2 is a transparent insulating substrate made of a glass material, such as soda lime glass, for example. A pair of through holes 30 and 31, which penetrate the base substrate 2, are formed in the base substrate 2. More specifically, one of the through holes 30 and 31, the through hole 30, is located on the base portion 12 side of the mounted piezoelectric vibrating reed 4, and the other through hole 31 is located on the tip end side of the vibrating arm portions 10 and 11.

A pair of through electrodes 32 and 33 are formed in the pair of through holes 30 and 31 such that the through electrodes 32 and 33 fill up the through holes 30 and 31. As shown in FIG. 3, the through electrodes 32 and 33 completely block the through holes 30 and 31 and maintain air-tightness in the cavity C. At the same time, the through electrodes 32 and 33 serve to achieve an electrical connection between external electrodes 38 and 39, which will be described later, and the routing electrodes 36 and 37.

Figure 2:
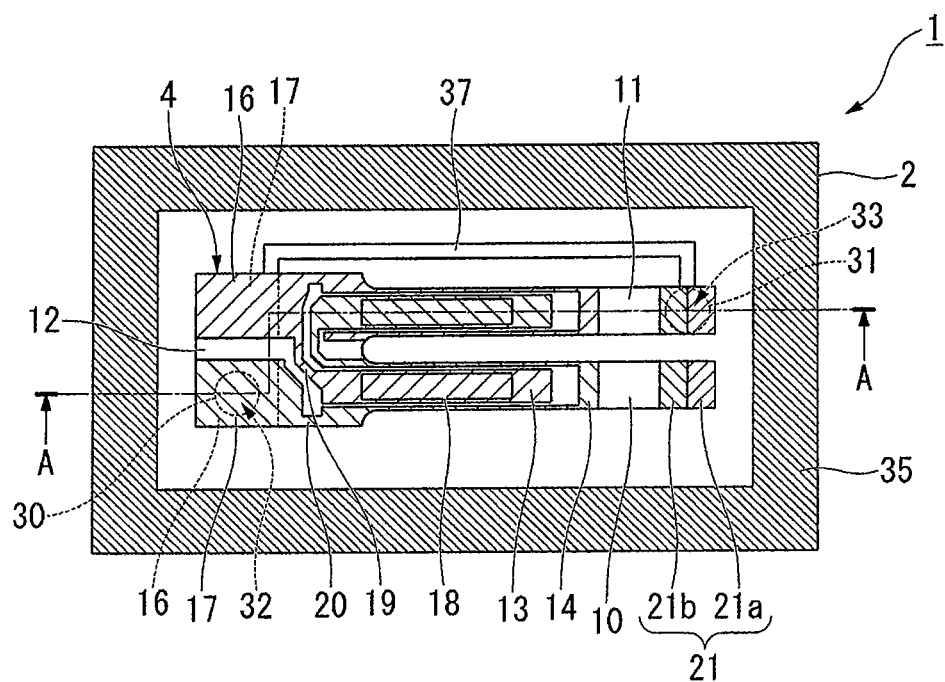
FIG. 2 is a top view of the piezoelectric vibrator according to the invention.

As shown in FIG. 2, a bonding film 35 for anodic bonding and the pair of routing electrodes 36 and 37 are patterned on the inner surface side of the base substrate 2 using a conductive material (for example, aluminum). The bonding film 35 is formed along the peripheral edge of the base substrate 2 so as to surround the periphery of the recessed portion 3a formed in the lid substrate 3.

Moreover, the pair of routing electrodes 36 and 37 are patterned such that one of the pair of through electrodes 32 and 33, the through electrode 32, is electrically connected to one of the pair of mount electrodes 16 and 17, the mount electrode 16, of the piezoelectric vibrating reed 4, and the other through electrode 33 is electrically connected to the other mount electrode 17 of the piezoelectric vibrating reed 4. More specifically, one of the routing electrodes 36 and 37, the routing electrode 36, is formed directly above the one through electrode 32 such that the routing electrode 36 is located directly below the base portion 12 of the piezoelectric vibrating reed 4. Further, the other routing electrode 37 is formed to be located directly above the other through electrode 33 after being led out from a position adjacent to the one routing electrode 36 towards the tip end side of the vibrating arm portions 10 and 11 along the vibrating arm portions 10 and 11.

The metal bumps B are formed on the pair of routing electrodes 36 and 37, respectively, and the piezoelectric vibrating reed 4 is mounted using the metal bumps B. Thus, the one mount electrode 16 of the piezoelectric vibrating reed 4 is electrically connected to the one through electrode 32 via the one routing electrode 36, and the other mount electrode 17 is electrically connected to the other through electrode 33 via the other routing electrode 37.

Further, the external electrodes 38 and 39, which are respectively electrically connected to the pair of through electrodes 32 and 33, are formed on the outer surface of the base substrate 2 as shown in FIG. 1. More specifically, one of the external electrodes 38 and 39, the external electrode 38, is electrically connected to the first excitation electrode 13 of the piezoelectric vibrating reed 4 via the one through electrode 32 and the one routing electrode 36. The other external electrode 39 is electrically connected to the second excitation electrode 14 of the piezoelectric vibrating reed 4 via the other through electrode 33 and the other routing electrode 37.

Note that, the term "electrode pattern" used in the present embodiment indicates an electrical pattern that electrically connects the piezoelectric vibrating reed 4 and the external electrodes 38 and 39. The electrode pattern includes, for example, the routing electrodes 36 and 37, and the through electrodes 32 and 33. In summary, the electrodes that electrically connect the external electrodes 38 and 39 and the metal bumps B are collectively referred to as the "electrode pattern".

When the piezoelectric vibrator 1 formed in this way is operated, a predetermined drive voltage is applied to the external electrodes 38 and 39 formed on the base substrate 2. Thus, a current can be applied to the excitation electrode 15 formed by the first excitation electrode 13 and the second excitation electrode 14 of the piezoelectric vibrating reed 4, and the pair of vibrating arm portions 10 and 11 are allowed to vibrate at a predetermined frequency in a direction to move closer to or away from each other. This vibration of the pair of vibrating arm portions 10 and 11 can be used as a time source, a timing source of control signals, a reference signal source, and the like.

1-2: Electrode Patterns

Figure 5:
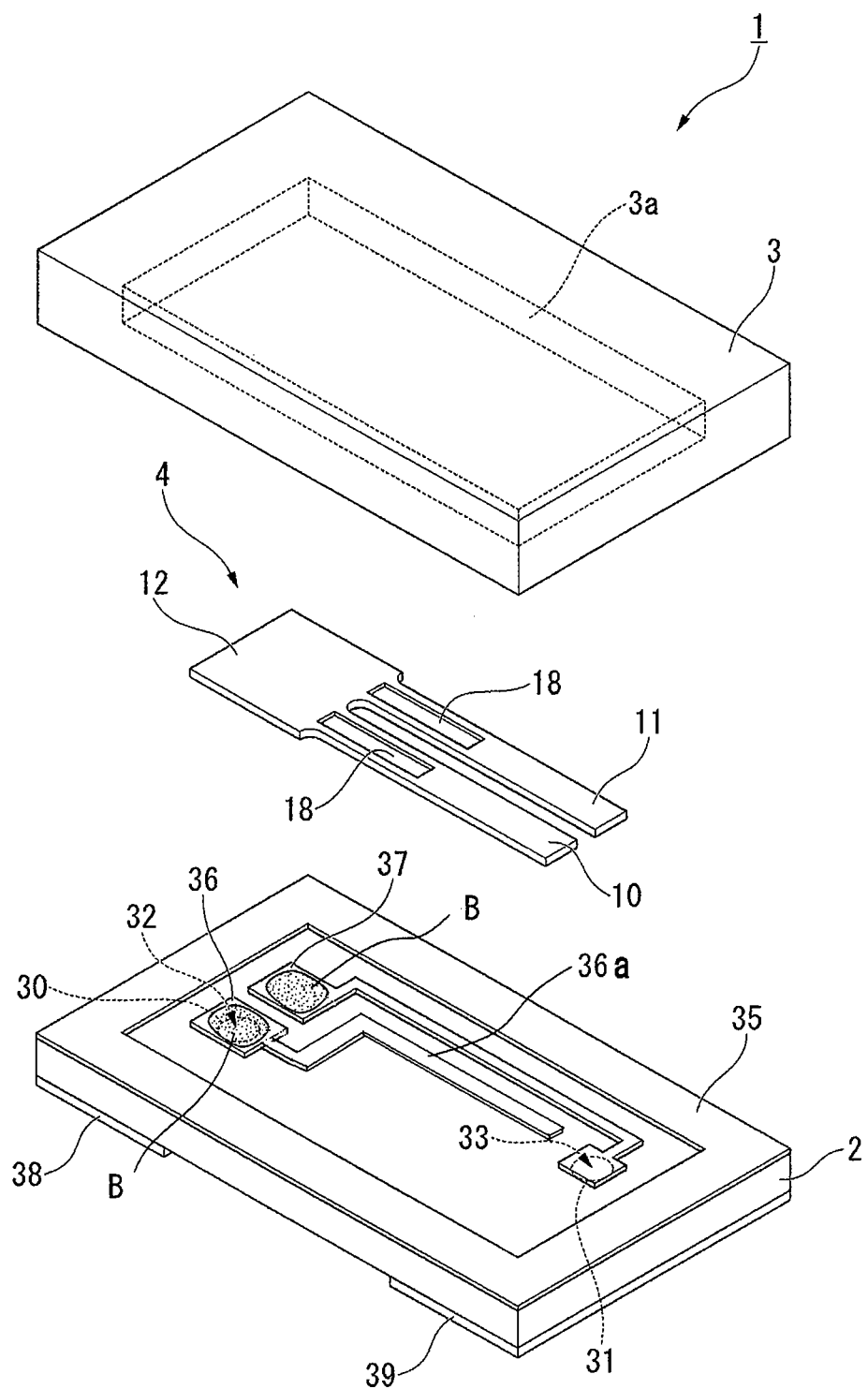
FIG. 5 is a schematic structural view of the piezoelectric vibrator according to a first embodiment.

The electrode patterns according to the present embodiment will be explained with reference to FIG. 5 and FIG. 6. As shown in FIG. 5, the routing electrodes 36 and 37 serving as the electrode pattern are formed on the inner surface side of the base substrate 2. A main object of the routing electrodes 36 and 37 is to electrically connect the through electrodes 32 and 33 and the metal bumps B. However, here, in addition to this, there is another feature that an "electrode pattern 36a for capacitance adjustment" is formed particularly for the routing electrode 36, and the electrode pattern 36a extends along the other routing electrode 37. As shown in FIG. 5 and FIG. 6, the electrode pattern 36a is provided extending from a position where the metal bump B and the through electrode 32 are located, such that the electrode pattern 36a closely faces the other routing electrode 37.

With this type of structure, since the electrode pattern 36a is provided close to the routing electrode 37, it is possible to increase a capacitance C0, namely, a capacitance of the piezoelectric vibrator 1 itself. Note that, although a distance between the electrode pattern 36a and the routing electrode 37 is not particularly limited, it is possible to further increase the capacitance C0 by narrowing the distance between them.

Further, as described above, in the present embodiment, the frequency adjustment of the piezoelectric vibrator 1 is performed by laser beam trimming. Therefore, as shown in FIG. 6A, it is necessary to not arrange the routing electrodes 36 and 37 and the electrode pattern 36a below the piezoelectric vibrating reed 4, at least in the vicinity of the tip end of the piezoelectric vibrating reed 4 (so as not to be affected by the laser beam).

Figure 6A:
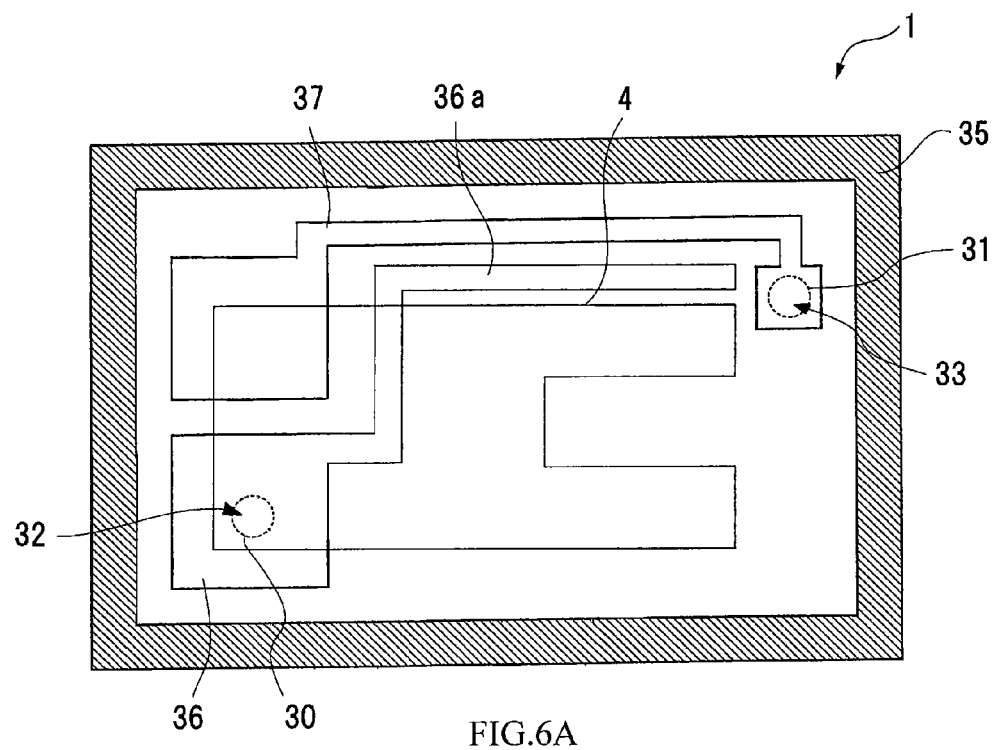
FIGS. 6A and 6B are schematic structural views of the piezoelectric vibrator according to the first embodiment.
Figure 6B:
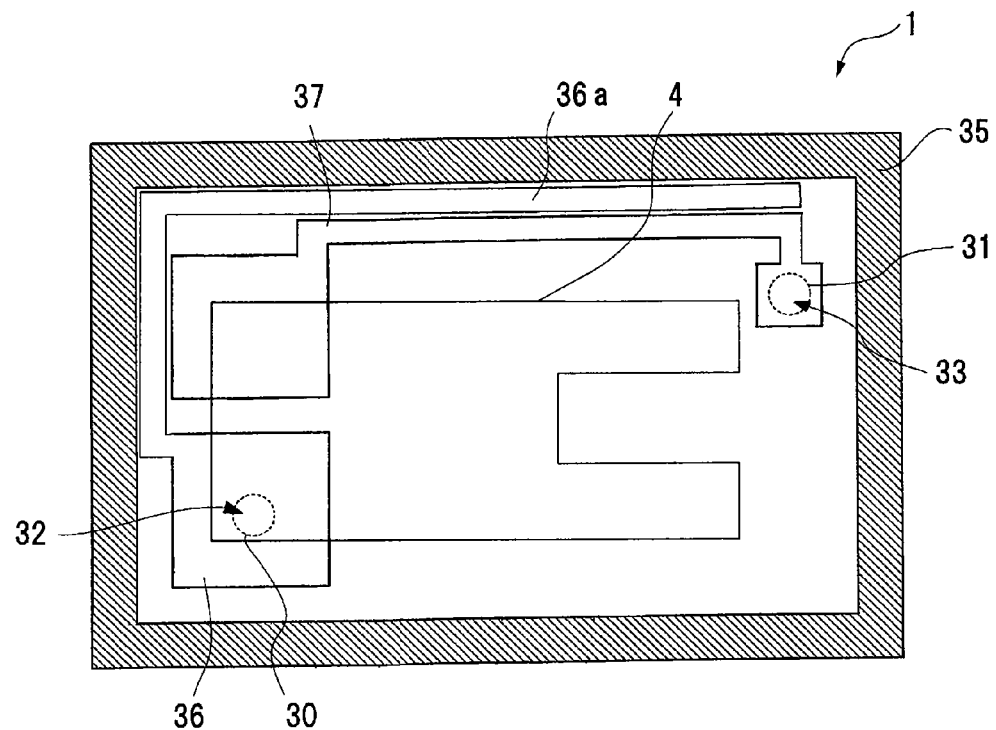

Note that the pattern shape of the electrode pattern 36a is not limited to the pattern shape shown in FIG. 6A. For example, as shown in FIG. 6B, the electrode pattern 36a may have a shape in which the electrode pattern 36a extends to the outside of the routing electrode 37 and then extends along the routing electrode 37 between the edge of the base substrate 2 and the routing electrode 37. Further, the electrode pattern 36a may be arranged such that it surrounds the routing electrode 37 along the routing electrode 37. In either case, since the electrode pattern 36a is arranged close to the routing electrode 37, the two electrodes to which different electrode voltages are applied are arranged close to each other. As a result, it is possible to increase the capacitance C0 of the piezoelectric vibrator 1 itself.

It should be noted here that JP-A-7-74581 referred to above as a known technology discloses that a dummy electrode is provided. However, the dummy electrode is not arranged close to a routing electrode. In the first place, the known technology does not disclose any technical idea of increasing the capacitance C0 by arranging an electrode pattern close to the routing electrode, and the present disclosure has a unique structure and significant advantageous effects that are not provided by the known technology.

1-3: Advantageous Effects of Electrode Patterns

Figure 17:
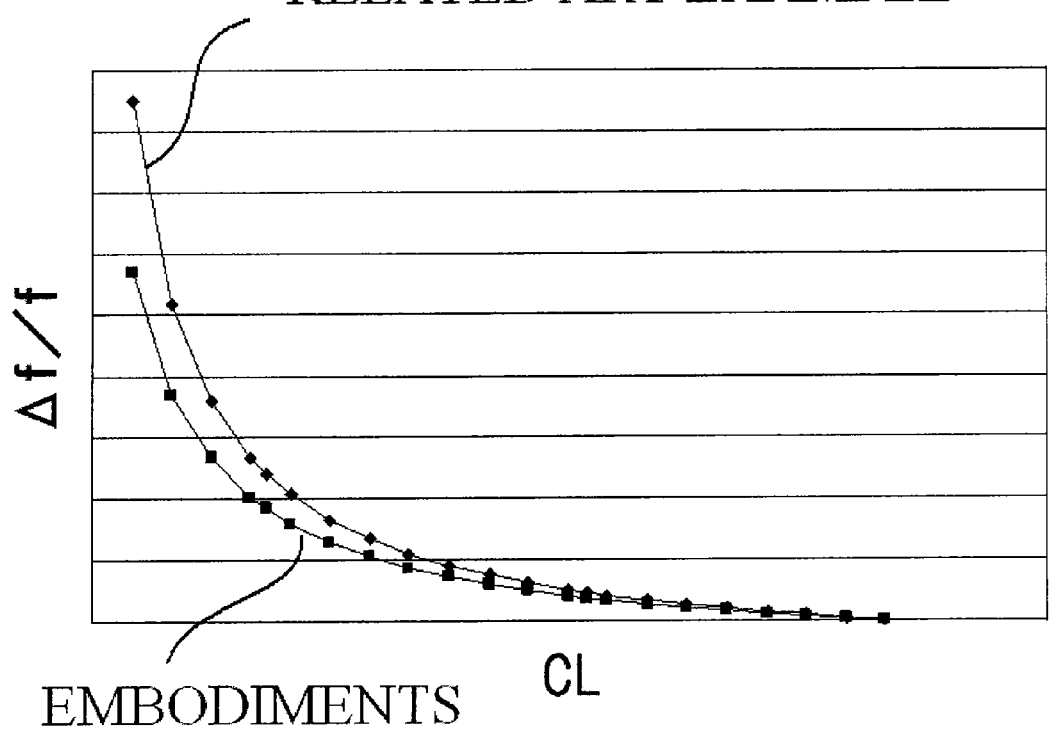
FIG. 17 shows comparison data in which varying characteristics of an example of related art are compared with varying characteristics of the invention.

Advantageous effects of the present embodiment will be explained with reference to FIG. 17. FIG. 17 shows comparison data in which varying characteristics of an example of related art are compared with varying characteristics of the invention. As described above, in the present embodiment, the electrode pattern 36a for capacitance adjustment is extended from the routing electrode 36, and thus it is possible to significantly increase the capacitance as compared to a known piezoelectric vibrator having the same size. As a result, as shown in FIG. 17, it is possible to suppress a frequency variation ($\Delta f/f$) to a lower value as compared to the example of related art. Particularly, in a region in which the value of the load capacitance (CL) is small, it is possible to significantly suppress the value of the frequency variation ($\Delta f/f$). Thus, it is possible to provide a piezoelectric vibrator having excellent electrical characteristics.

Further, in the present embodiment, a portion of the routing electrode 36, which is provided also in the related art, is extended along the other routing electrode 37. With this arrangement, it is intended to increase the capacitance C0. As a result, it is possible to increase the capacitance C0 with a simple structure without particularly changing the overall size of the piezoelectric vibrator 1 itself, and it is therefore possible to achieve miniaturization and cost reduction. In addition, since the electrode pattern 36a is formed in a same process as the routing electrode 36, there is no need to separately implement a complicated process in order to increase the capacitance C0. Note that the routing electrodes 36 and 37, and the electrode pattern 36a are formed by patterning a conductive material on the base substrate 2.

1-4: Oscillator, Electronic Device and Radio Timepiece

Hereinafter, an oscillator, an electronic device and a radio timepiece, on which the above-described piezoelectric vibrator 1 can be electrically mounted, will be explained.

Figure 14:
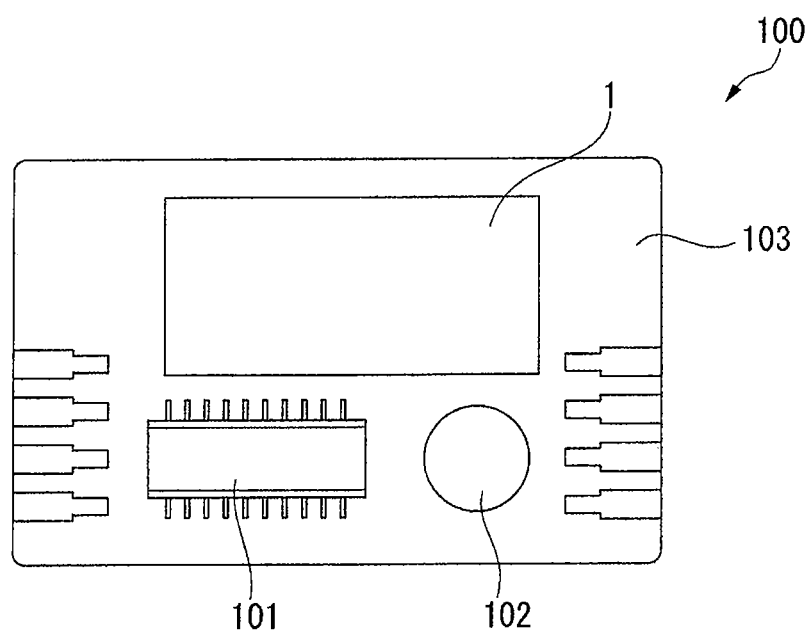
FIG. 14 is a schematic structural view of an oscillator according to the invention.

In an oscillator 100, the piezoelectric vibrator 1 is formed as an oscillation element that is electrically connected to an integrated circuit 101 as shown in FIG. 14. The oscillator 100 is provided with a substrate 103 on which an electronic component 102 such as a capacitor is mounted. The above-described integrated circuit 101 for the oscillator is mounted on the substrate 103, and the piezoelectric vibrator 1 is mounted in the vicinity of the integrated circuit 101. The electronic component 102, the integrated circuit 101 and the piezoelectric vibrator 1 are respectively and electrically connected by wiring patterns, which are not shown in the drawings. Note that each of the structural components is molded by resin, which is not shown in the drawings.

In the oscillator 100 structured in this manner, when a voltage is applied to the piezoelectric vibrator 1, the piezoelectric vibrating reed 4 in the piezoelectric vibrator 1 vibrates. The vibration is converted to an electrical signal by a piezoelectric property of the piezoelectric vibrating reed 4, and input to the integrated circuit 101 as an electrical signal. The input electrical signal is subjected to various types of processing by the integrated circuit 101 and is output as a frequency signal. Thus, the piezoelectric vibrator 1 functions as an oscillation element. Further, by selectively setting the structure of the integrated circuit 101, for example, to a real time clock (RTC) module or the like in response to demand, in addition to a single-function oscillator for a timepiece and the like, it is possible to add a function of controlling an operation date or time of the device or an external device or a function of providing time or a calendar.

As described above, the oscillator 100 of the present embodiment is provided with the high quality piezoelectric vibrator 1 in which airtightness in the cavity C is reliable and operation reliability is improved. Therefore, it is also possible to similarly improve the quality of the oscillator 100 itself such that operation reliability is improved. In addition to this, stable and highly accurate frequency signals can be obtained over a long period of time.

Next, one embodiment of an electronic device according to the invention will be explained with reference to FIG. 15. Note that a portable information device 110 having the above-described piezoelectric vibrator 1 will be explained as an example of the electronic device. First, the portable information device 110 according to the present embodiment is represented by a mobile phone, for example, and is made by developing and improving a wrist watch in related art.

Figure 15:
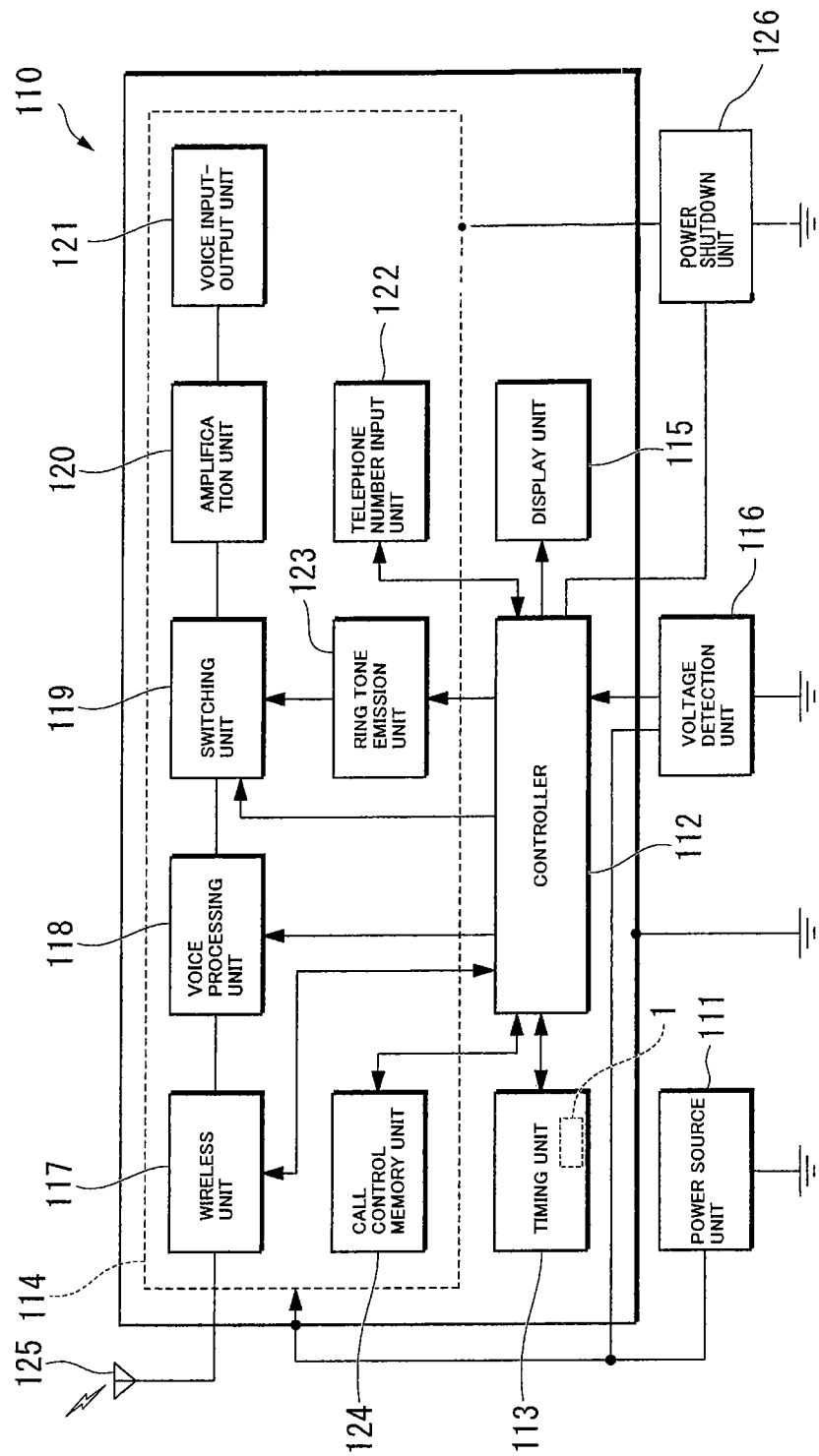
FIG. 15 is a schematic structural view of an electronic device according to the invention.

As shown in FIG. 15, the portable information device 110 is provided with the piezoelectric vibrator 1 and a power supply portion 111 to supply electric power. The power supply portion 111 is formed by a lithium secondary battery, for example. A control portion 112 that performs various types of control, a time measuring portion 113 that counts time etc., a communication portion 114 that performs communication with the outside, a display portion 115 that displays various types of information, and a voltage detection portion 116 that detects a voltage of each of the functional portions are connected in parallel to the power supply portion 111. Electric power is supplied to each of the functional portions by the power supply portion 111.

The control portion 112 controls each of the functional portions and thereby performs operation control of the entire system, such as transmission and reception of audio data, measurement and display of current time, and the like. Further, the control portion 112 is provided with a ROM into which a program is written in advance, a CPU that reads and executes the program written into the ROM, a RAM that is used as a work area of the CPU, and the like.

The time measuring portion 113 is provided with an integrated circuit that incorporates an oscillation circuit, a register circuit, a counter circuit and an interface circuit etc., and the piezoelectric vibrator 1. When a voltage is applied to the piezoelectric vibrator 1, the piezoelectric vibrating reed 4 vibrates. The vibration is converted to an electrical signal due to piezoelectric property of crystal, and is input to the oscillation circuit as the electrical signal. The output of the oscillation circuit is binarized and measured by the register circuit and the counter circuit. Then, signal transmission and reception with the control portion 112 is performed via the interface circuit, and current time, current date or calendar information etc. is displayed on the display portion 115.

The communication portion 114 has similar functions to those of the mobile phone of the related art, and is provided with a wireless portion 117, an audio processing portion 118, a switching portion 119, an amplifier portion 120, an audio input/output portion 121, a telephone number input portion 122, a ring tone generation portion 123 and a call control memory portion 124.

The wireless portion 117 carries out transmission and reception of various types of data, such as audio data, with a base station via an antenna 125. The audio processing portion 118 encodes and decodes an audio signal input from the wireless portion 117 or the amplifier portion 120. The amplifier portion 120 amplifies a signal input from the audio processing portion 118 or the audio input/output portion 121 to a predetermined level. The audio input/output portion 121 is formed by a speaker, a microphone and the like, and makes a ring tone and incoming audio louder and collects audio.

The ring tone generation portion 123 generates a ring tone in response to a call from the base station. The switching portion 119 switches the amplifier portion 120 connected to the audio processing portion 118 to the ring tone generation portion 123 only when a call arrives, so that the ring tone generated in the ring tone generation portion 123 is output to the audio input/output portion 121 via the amplifier portion 120. Note that the call control memory portion 124 stores a program relating to incoming and outgoing call control for communications. The telephone number input portion 122 includes, for example, numeric keys from 0 to 9 and other keys and the telephone number of a call destination is input by depressing these numeric keys and the like.

The voltage detection portion 116 detects a voltage drop and notifies the control portion 112 of it when a voltage applied by the power supply portion 111 to each of the functional portions, such as the control portion 112, drops below a predetermined value. The predetermined voltage value in this case is a value pre-set as the lowest voltage necessary to operate the communication portion 114 stably, and is, for example, about 3V. When receiving a notification of the voltage drop from the voltage detection portion 116, the control portion 112 disables operations of the wireless portion 117, the audio processing portion 118, the switching portion 119 and the ring tone generation portion 123. In particular, it is essential to stop the operation of the wireless portion 117 that consumes a large amount of electric power. Furthermore, a message informing that the communication portion 114 is unavailable due to insufficient battery power is displayed on the display portion 115.

More specifically, it is possible to disable the operation of the communication portion 114 by the voltage detection portion 116 and the control portion 112, and to display the notification message on the display portion 115. Although a character message may be used for this display, an x (cross) mark may be put on a telephone icon displayed on an upper section of a display screen of the display portion 115, as a more intuitive display. Note that, by providing a power supply shutdown portion 126 that is capable of selectively shutting down the power supply to portions involved with the function of the communication portion 114, it is possible to stop the function of the communication portion 114 in a more reliable manner.

As described above, the portable information device 110 of the present embodiment is provided with the high quality piezoelectric vibrator 1 in which airtightness in the cavity C is reliable and operation reliability is improved. Therefore, it is also possible to similarly improve the quality of the portable information device itself such that operation reliability is improved. In addition to this, it is possible to display stable and highly accurate timepiece information over a long period of time.

Figure 16:
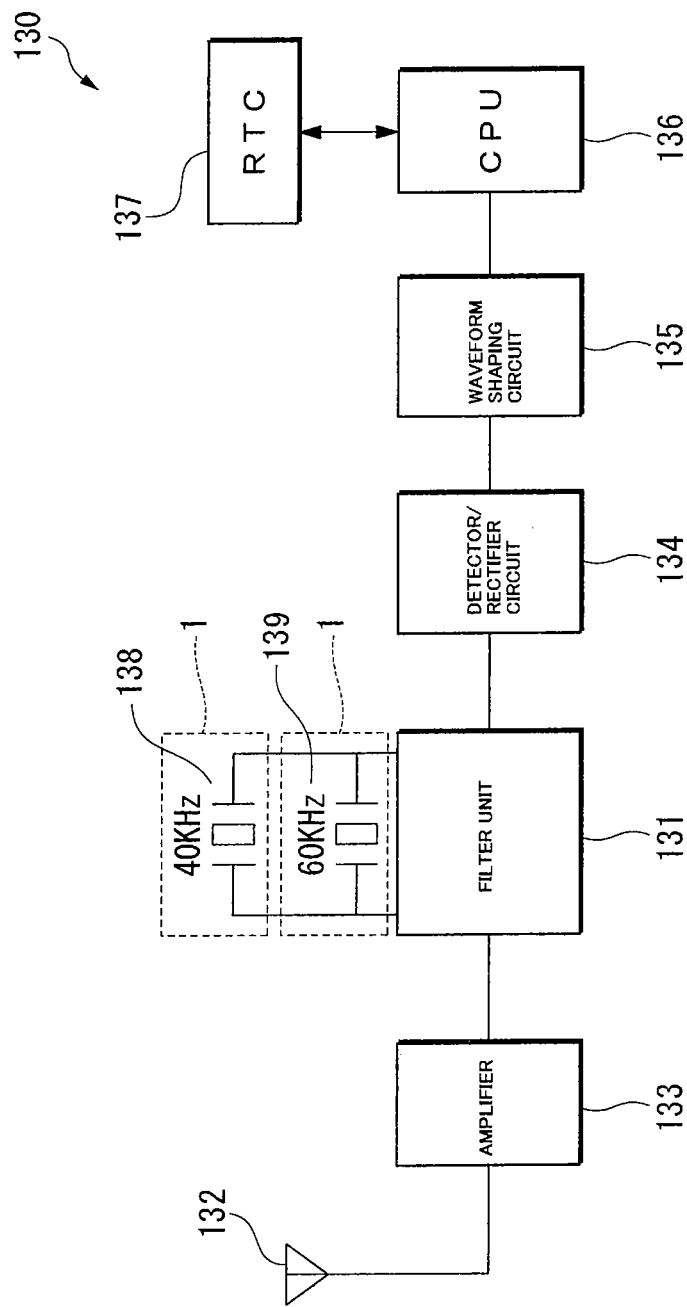
FIG. 16 is a schematic structural view of a radio timepiece according to the invention.

Next, a radio timepiece 130 according to the present embodiment will be explained with reference to FIG. 16. The radio timepiece 130 is provided with the piezoelectric vibrator 1 that is electrically connected to a filter portion 131. The radio timepiece 130 is a timepiece that has a function of receiving a standard wave including timepiece information, and a function of automatically correcting the standard wave to a correct time and displaying it.

In Japan, transmitting stations (transmitter stations) for transmitting standard waves are located in Fukushima prefecture (40 kHz) and Saga prefecture (60 kHz), and transmit standard waves, respectively. A long wave corresponding to 40 kHz or 60 kHz has a property of propagating on the ground surface and also has a property of propagating while being reflected by an ionized layer and the ground surface. Accordingly, the propagation range is wide and the above-mentioned two transmitting stations cover the entire area of Japan.

Hereinafter, a functional structure of the radio timepiece 130 will be explained in detail.

An antenna 132 receives a standard wave that is a long wave of 40 kHz or 60 kHz. The standard wave, which is a long wave, is a wave that is obtained by performing AM modulation of time information, which is called a time code, on a carrier wave of 40 kHz or 60 kHz. The received standard wave, which is a long wave, is amplified by an amplifier 133, and is filtered and tuned by the filter portion 131 having a plurality of the piezoelectric vibrators 1. The piezoelectric vibrators 1 of the present embodiment are respectively provided with crystal oscillator portions 138 and 139 having resonance frequencies of 40 kHz and 60 kHz, which are the same as the above-described carrier frequencies.

Further, the filtered signal with a predetermined frequency is detected and demodulated by a detection and rectification circuit 134. Then, the time code is taken out through a waveform shaping circuit 135 and is counted by a CPU 136. The CPU 136 reads information of a current year, cumulative days, a day of the week, a time of day, and the like. The read information is reflected on an RTC 137 and correct time information is displayed. Since the carrier wave is 40 kHz or 60 kHz, the above-described oscillator having a tuning-fork type structure is preferably used as the crystal oscillator portions 138 and 139.

Note that, although the above-described explanation is made using an example in Japan, the frequencies of long wave standard waves are different in overseas countries. For example, the standard wave with a frequency of 77.5 kHz is used in Germany. Accordingly, when the radio timepiece 130 that is also compatible in overseas countries is incorporated into a portable device, the piezoelectric vibrator 1 having a frequency different from the frequency used in Japan is further necessary.

As described above, the radio timepiece 130 of the present embodiment is provided with the high quality piezoelectric vibrator 1 in which airtightness in the cavity C is reliable and operation reliability is improved. Therefore, it is also possible to similarly improve the quality of the radio timepiece itself such that operation reliability is improved. In addition to this, it is possible to count time stably and highly accurately over a long period of time.

As described above, according to the present embodiment, it is possible to provide a piezoelectric vibrator, an oscillator, an electronic device and a radio timepiece that are capable of increasing the capacitance C0 while achieving miniaturization and cost reduction.

Second Embodiment

Figure 7:
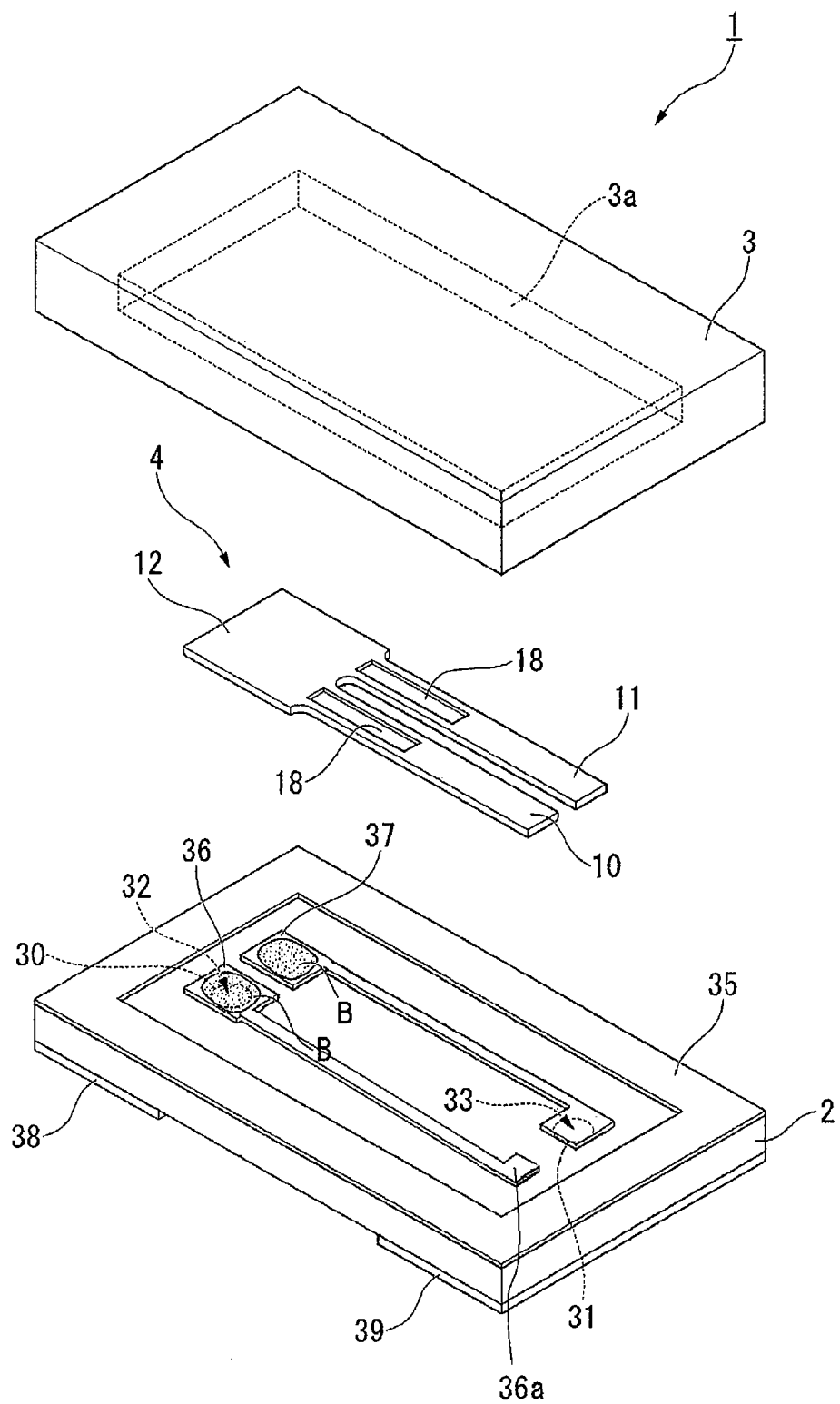
FIG. 7 is a schematic structural view of the piezoelectric vibrator according to a second embodiment.
Figure 8:
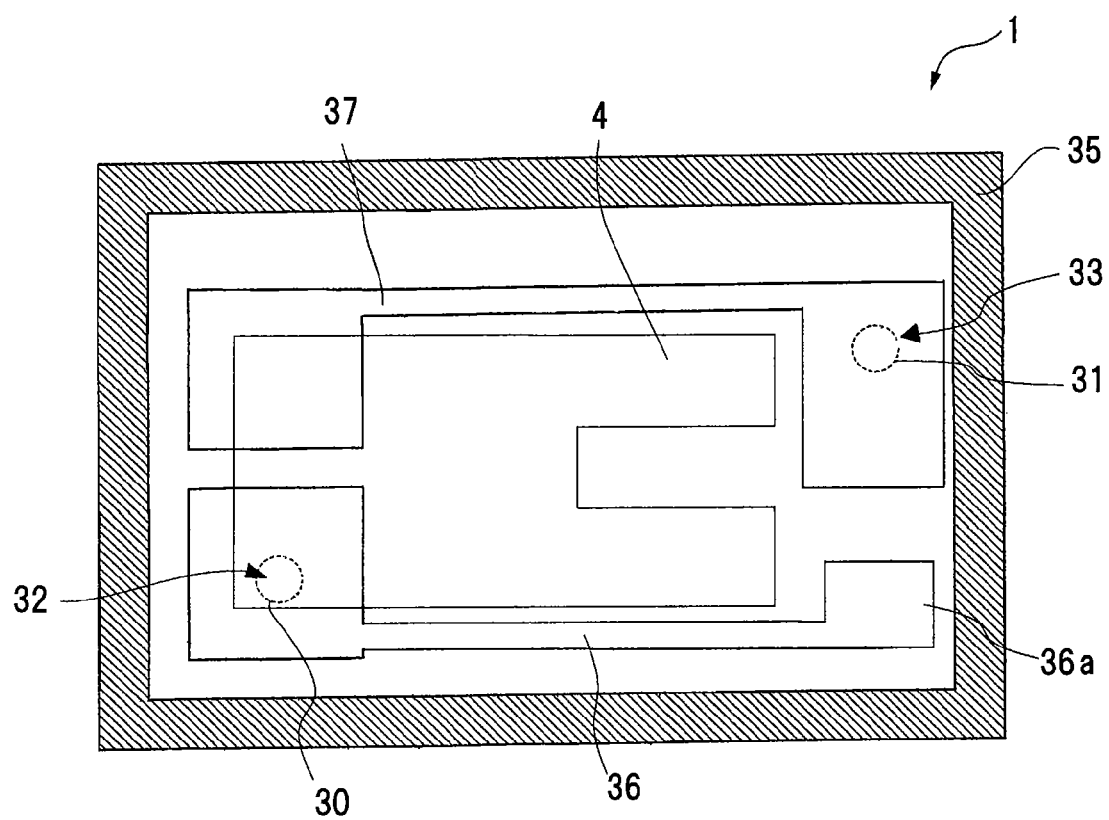
FIG. 8 is a schematic structural view of the piezoelectric vibrator according to the second embodiment.

A second embodiment of the invention will be explained with reference to FIG. 7 and FIG. 8. Note that the present embodiment is different from the first embodiment only in the shape of the electrode pattern on the inner surface side of the base substrate 2. Operational effects of the second embodiment are also substantially the same as those of the first embodiment. Therefore, hereinafter, the shape of the electrode pattern according to the present embodiment only will be explained and an explanation of the other structural components is omitted.

2-1: Electrode Patterns

In a similar way to the first embodiment, the electrode patterns, which electrically connect the piezoelectric vibrating reed 4 and the external electrodes 38 and 39, are formed in the piezoelectric vibrator 1. For example, the routing electrodes 36 and 37 and the through electrodes 32 and 33 are included in the electrode patterns.

In the present embodiment, on the tip end side of the piezoelectric vibrating reed 4, the routing electrode 36 is extended to a region facing the external electrode 39 in a thickness direction of the base substrate 2. Thus, the external electrode 39 and the routing electrode 36 face each other in the thickness direction of the base substrate 2. Note that, a portion of the routing electrode 36 that faces the external electrode 39 is referred to as an external electrode facing portion 36a. Also a portion of the routing electrode 37 that is joined to the metal bump B on the base portion side of the piezoelectric vibrating reed 4 faces the external electrode 38 having a different polarity. Therefore, this portion can be referred to as an external electrode facing portion of the routing electrode 37.

With the above-described structure, the routing electrodes 36 and 37 respectively face the external electrodes 39 and 38 having different polarities in the thickness direction of the base substrate 2. It is therefore possible to increase the capacitance C0 of the piezoelectric vibrator 1 itself. Note that, as the area of the external electrode facing portion 36a is increased, the area of the region facing the external electrode 39 is increased, and it is therefore possible to further increase the capacitance C0 (this also applies to the external electrode facing portion of the routing electrode 37). Further, as described above, the frequency adjustment of the piezoelectric vibrating reed 4 is performed by laser beam trimming. Therefore, it is preferable that the external electrode facing portion 36a is not arranged below the piezoelectric vibrating reed 4 at least in the vicinity of the tip end of the piezoelectric vibrating reed 4 (so as not to be affected by the laser beam). More specifically, it is preferable that, when viewed from a normal line direction of the base substrate 2, the external electrode facing portion 36a is provided in a position where it does not overlap with a tip end portion of the piezoelectric vibrating reed 4.

Third Embodiment

Figure 9:
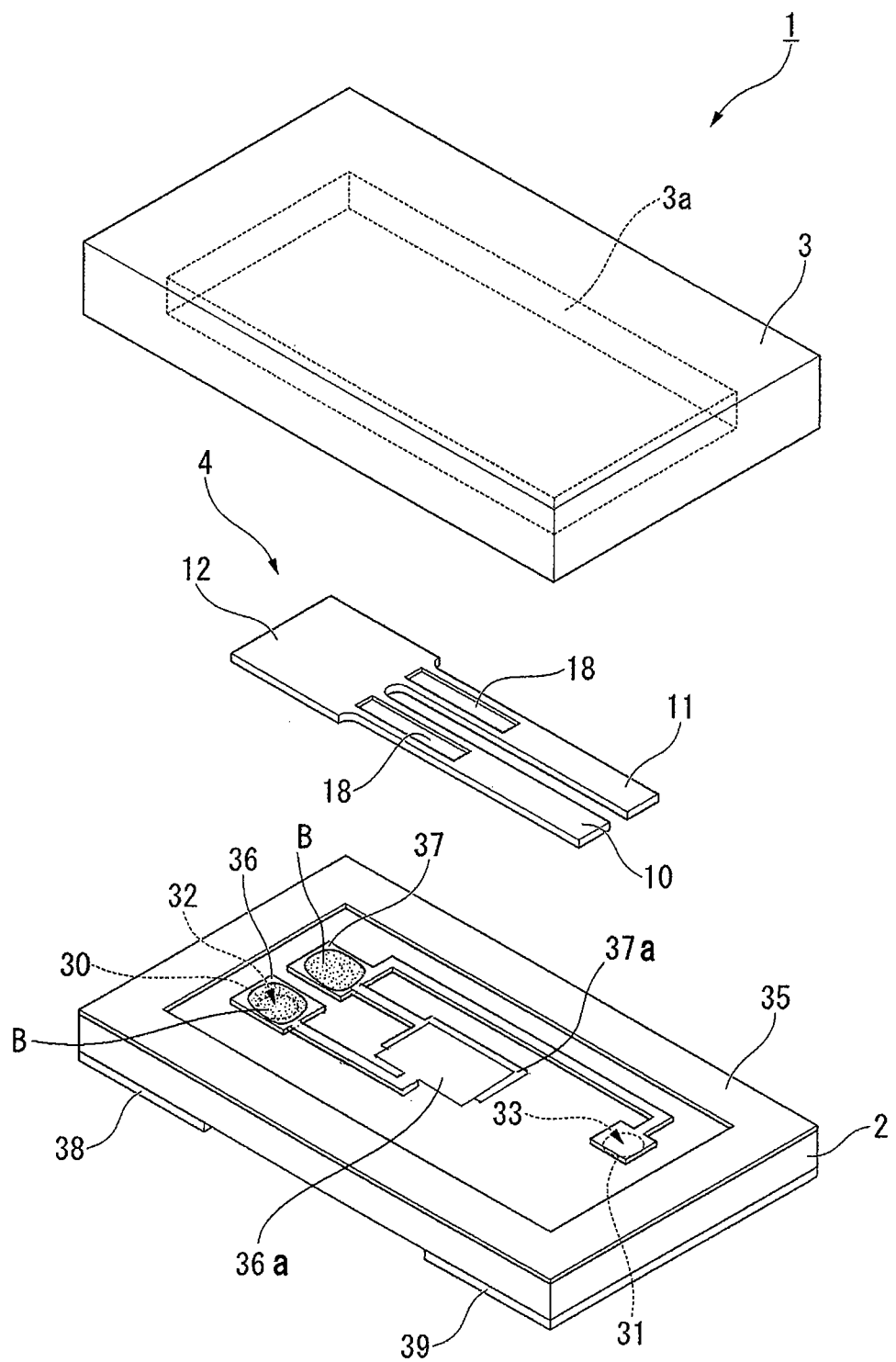
FIG. 9 is a schematic structural view of the piezoelectric vibrator according to a third embodiment.
Figure 10A:
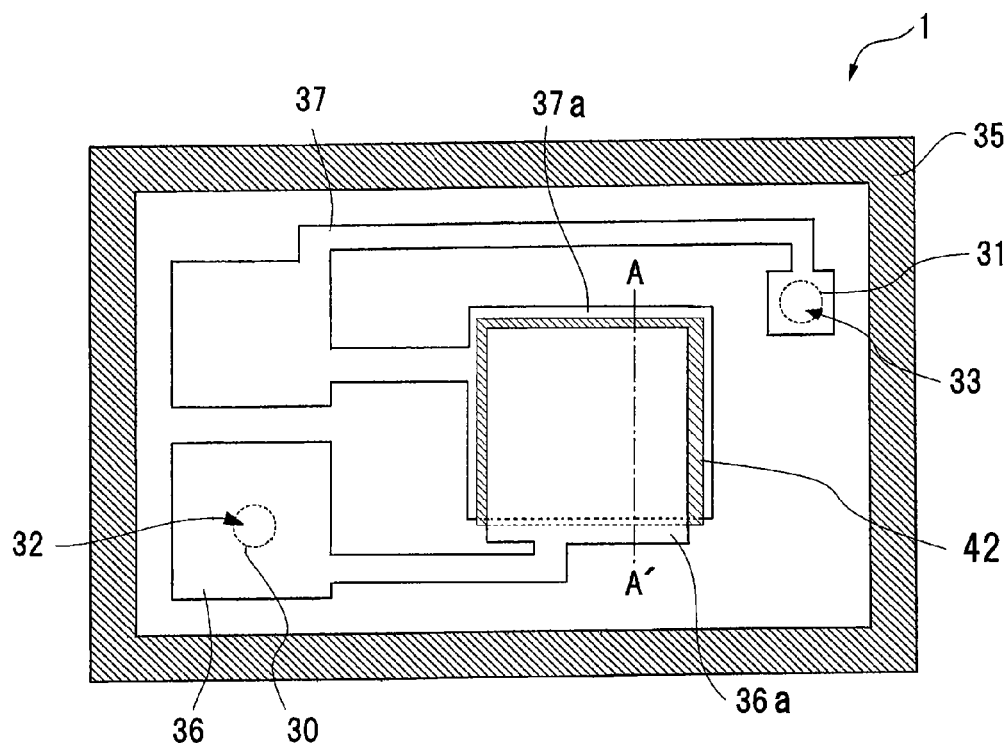
FIGS. 10A and 10B are schematic structural views of the piezoelectric vibrator according to the third embodiment.

A third embodiment of the invention will be explained with reference to FIG. 9 and FIG. 10. Note that the present embodiment is different from the first and second embodiments only in the shape of the electrode pattern on the inner surface side of the base substrate 2. Operational effects of the third embodiment are also substantially the same as those of the first and second embodiments. Therefore, hereinafter, the shape of the electrode pattern according to the present embodiment only will be explained and an explanation of the other structural components is omitted.

3-1: Electrode Patterns

In a similar way to the first and second embodiments, the electrode patterns, which electrically connect the piezoelectric vibrating reed 4 and the external electrodes 38 and 39, are formed in the piezoelectric vibrator 1. For example, the routing electrodes 36 and 37 and the through electrodes 32 and 33 are included in the electrode patterns.

Figure 10B:
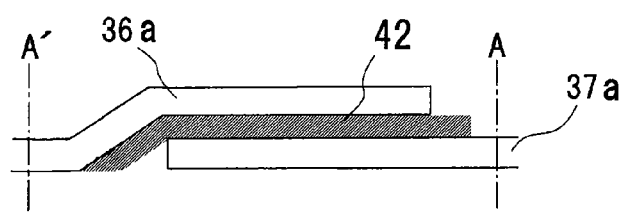

On the inner surface side of the base substrate 2, the routing electrodes 36 and 37 are formed as the electrode pattern that electrically connects the through electrodes 32 and 33 and the metal bumps B. Further, in the present embodiment, a first overlapping electrode portion 36a that extends from the routing electrode 36, and a second overlapping electrode portion 37a that extends from the routing electrode 37 are provided. A feature of the present embodiment is that the first and second overlapping electrode portions 36a and 37a are provided such that they overlap with each other with a dielectric substance 42 interposed between them. FIG. 10B is a view showing a state in which the first and second overlapping electrode portions 36a and 37a overlap with each other such that the dielectric substance 42 is interposed between them.

With the above-described structure, since the first and second overlapping electrode portions 36a and 37a are overlapped with each other with the dielectric substance 42 interposed between them, the electrodes having different polarities are arranged to face each other. It is thus possible to increase the capacitance C0 of the piezoelectric vibrator 1 itself. Note that, although a distance between the first and second overlapping electrode portions 36a and 37a is not particularly limited, it is possible to further increase the capacitance C0 by narrowing the distance between them. Further, this also leads to miniaturization of the piezoelectric vibrator 1. Further, it is also possible to further increase the capacitance C0 by increasing the area of the first and second overlapping electrode portions 36a and 37a. In addition, as described above, the frequency adjustment of the piezoelectric vibrating reed 4 is performed by laser beam trimming. Therefore, it is preferable that the routing electrodes 36 and 37 and the first and second overlapping electrode portions 36a and 37a are not arranged below the piezoelectric vibrating reed 4 at least in the vicinity of the tip end of the piezoelectric vibrating reed 4 (so as not to be affected by the laser beam). More specifically, it is preferable that, when viewed from the normal line direction of the base substrate 2, the first and second overlapping electrode portions 36a and 37a are provided in a position where they do not overlap with the tip end portion of the piezoelectric vibrating reed 4.

Fourth Embodiment

Figure 11:
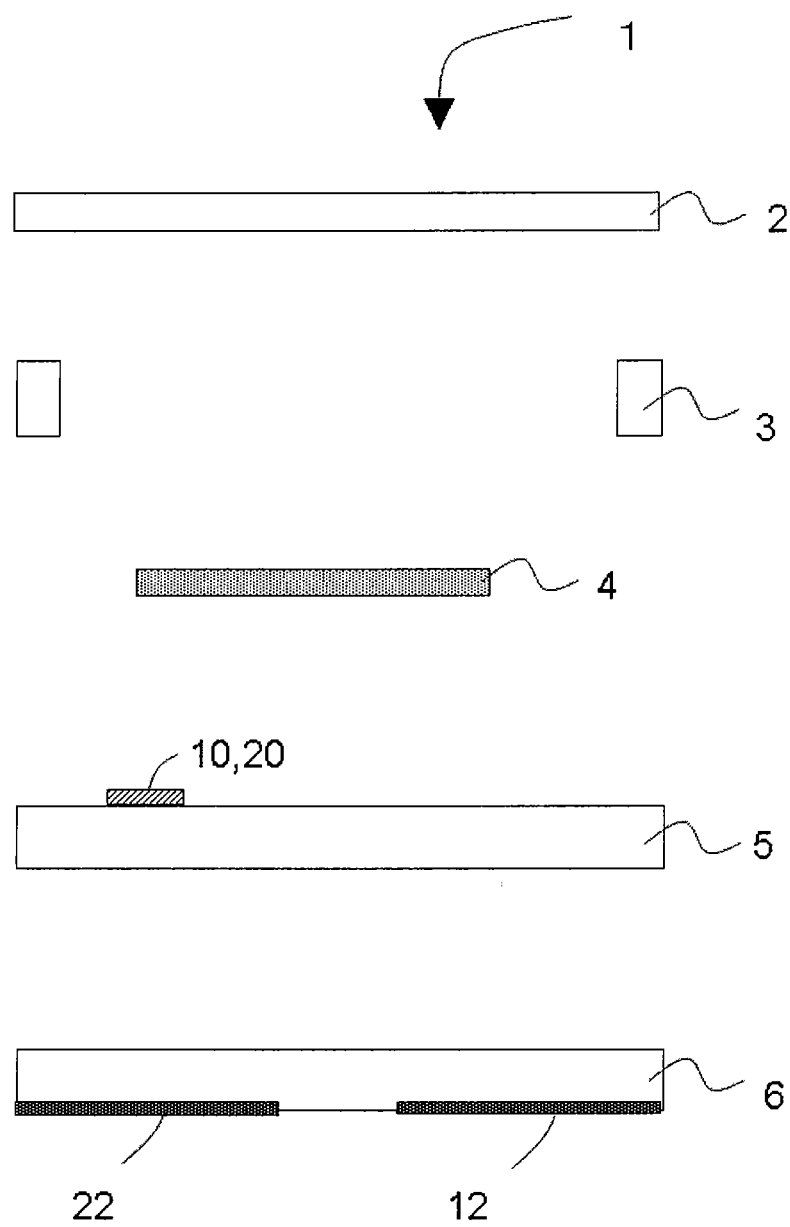
FIG. 11 is a schematic structural view of the piezoelectric vibrator according to a fourth embodiment.

A fourth embodiment of the invention will be explained with reference to FIG. 11 to FIG. 13. In the present embodiment, a ceramic multilayer substrate, which is formed by stacking a plurality of ceramic sheets in a thickness direction, is used as the base substrate 2. Note that the structure of the piezoelectric vibrating reed 4 is the same as that explained in the first to third embodiments, and thus an explanation thereof will be omitted here and only points that are different from the first to third embodiments will be explained.

4-1: Ceramic Multilayer Substrate

The piezoelectric vibrator 1 includes: a ceramic multilayer substrate that is obtained by stacking ceramic sheets (which are also referred to as green sheets) 5 and 6 in the thickness direction; the piezoelectric vibrating reed 4; a ceramic sheet 3 that is formed in a frame shape; and a lid substrate 2 made of metal. Note that the number of the ceramic sheets is not limited to this example, and more ceramic sheets may be stacked. Although here a metal lid member is used as the lid substrate 2, a glass or ceramic member may be used as the lid substrate 2. Further, although here the frame-shaped ceramic sheet 3 is used, a seal ring or the like may be used.

Two electrode terminals 10 and 20 are provided on an inner surface side of the uppermost ceramic sheet 5 that is included in the base substrate, and lead-out electrodes (not shown in the drawings) provided on the base portion of the piezoelectric vibrator 1 are joined to the electrode terminals 10 and 20. External electrodes 12 and 22 are provided on an outer surface of the ceramic sheet 6 that forms a bottom surface. A conductive adhesive or the like is used to join the piezoelectric vibrator 1 and the electrode terminals 10 and 20. Electrode patterns are formed between the electrode terminals 10 and 20 and the external electrodes 12 and 22 in order to electrically connect them.

The piezoelectric vibrator 1 can be obtained by integrally burning the above-described ceramic sheets 3, 5 and 6 in a state in which they are laminated in the thickness direction. Further, since the ceramic sheet 3 is a frame-shaped sheet, after the plurality of ceramic sheets have been integrally burned, a recessed portion is formed by the ceramic sheets 3 and 5, and the recessed portion can be used to house the piezoelectric vibrating reed 4. Note that, in order to secure a vibration space of the piezoelectric vibrating reed 4, a concave portion (or a cutout portion) may be provided in the ceramic sheet 5.

The electrode patterns are formed between the ceramic sheet 5 (on which the electrode terminals 10 and 20 are formed) and the ceramic sheet 6 (on which the external electrodes 12 and 22 are formed). Note that these electrodes (i.e., the electrode terminals 10 and 20, the external electrodes 12 and 22, and the electrode patterns) are each formed by a metalized layer made of tungsten or the like, and a metal layer made of nickel, gold or the like that is formed on the metalized layer.

4-2: Structure of Electrode Patterns

Figure 12A:
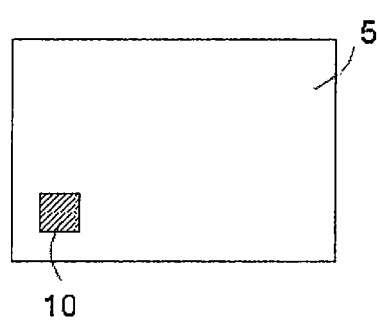
FIGS. 12A-12F are schematic structural views of the piezoelectric vibrator according to the fourth embodiment.
Figure 12D:
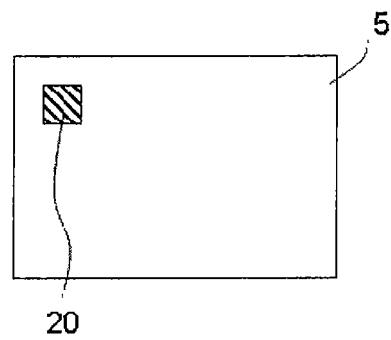
Figure 12B:
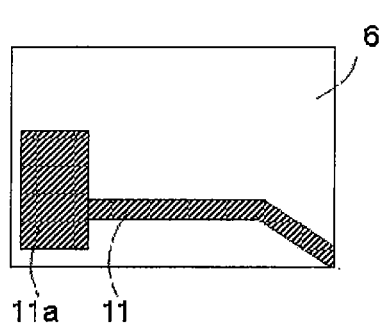
Figure 12E:
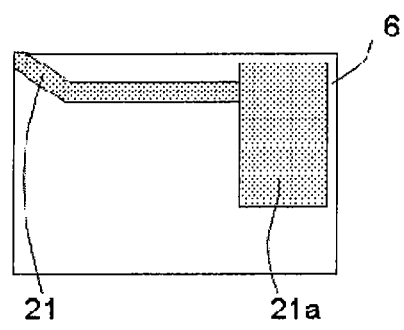
Figure 12C:
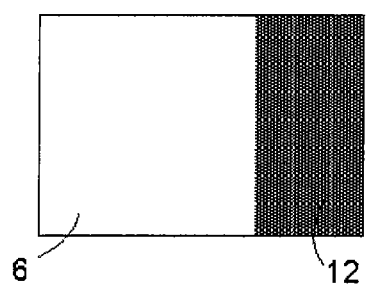
Figure 12F:
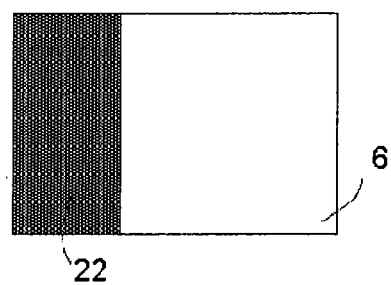

A structure of electrode patterns that electrically connect the electrode terminals 10 and 20 and the external electrodes 12 and 22 will be explained with reference to FIG. 12 and FIG. 13. FIG. 12A to FIG. 12C respectively show the electrode terminal 10, an electrode pattern 11 and the external electrode 12 that correspond to one of the polarities. FIG. 12D to FIG. 12F respectively show the electrode terminal 20, an electrode pattern 21 and the external electrode 22 that correspond to the other polarity.

To be more precise, since FIG. 12A and FIG. 12D respectively show the electrode terminals 10 and 20, they are top views of the ceramic sheet 5 that is located on the highest level, and FIG. 12B and FIG. 12E are respectively top views of the ceramic sheet 6 that is located on the lowest level (the bottom surface). Further, FIG. 12C and FIG. 12F are respectively bottom views (showing the appearance of the bottom surface) of the ceramic sheet 6 that is located on the lowest level (the bottom surface) because the external electrodes 12 and 22 are formed. FIG. 13 shows schematic cross-sectional views when the piezoelectric vibrator 1 is seen from respective side surfaces.

Here, as shown in FIG. 12B, the electrode pattern 11 having a predetermined shape is formed on a top surface of the ceramic sheet 6 (namely, between the ceramic sheet 6 and the ceramic sheet 5). Note that the electrode pattern 11 and the electrode terminal 10 shown in FIG. 12A or the external electrode 12 shown in FIG. 12C are electrically connected by a via hole. Further, the electrode pattern 11 is provided with an extended portion 11a for facing the external electrode, and the extended portion 11a extends in a surface direction of the ceramic sheet 6. The extended portion 11a faces the external electrode 22 (shown in FIG. 12F) that corresponds to the other polarity, in the thickness direction of the ceramic multilayer substrate.

In a similar way, as shown in FIG. 12E, the electrode pattern 21 having a predetermined shape is formed on the top surface of the ceramic sheet 6. Note that the electrode pattern 21 and the electrode terminal 20 shown in FIG. 12D or the external electrode 22 shown in FIG. 12F are electrically connected by a via hole. Further, the electrode pattern 21 is provided with an extended portion 21a for facing the external electrode, and the extended portion 21a extends in the surface direction of the ceramic sheet 6. The extended portion 21a faces the external electrode 12 (shown in FIG. 12C) that corresponds to the other polarity, in the thickness direction of the ceramic multilayer substrate.

In this way, in the present embodiment, the electrode patterns 11 and 21 corresponding to the respective polarities are respectively provided with the extended portions 11a and 21a for facing the external electrodes. These extended portions 11a and 21a face the external electrodes 12 and 22 having different polarities in the thickness direction. Therefore, the electrodes having different polarities face each other. Thus, it is possible to increase the capacitance C0 of the piezoelectric vibrator 1 itself. Note that it is also possible to further increase the capacitance C0 by narrowing a distance between the extended portions 11a and 21a and the external electrodes 12 and 22.

Figure 13:
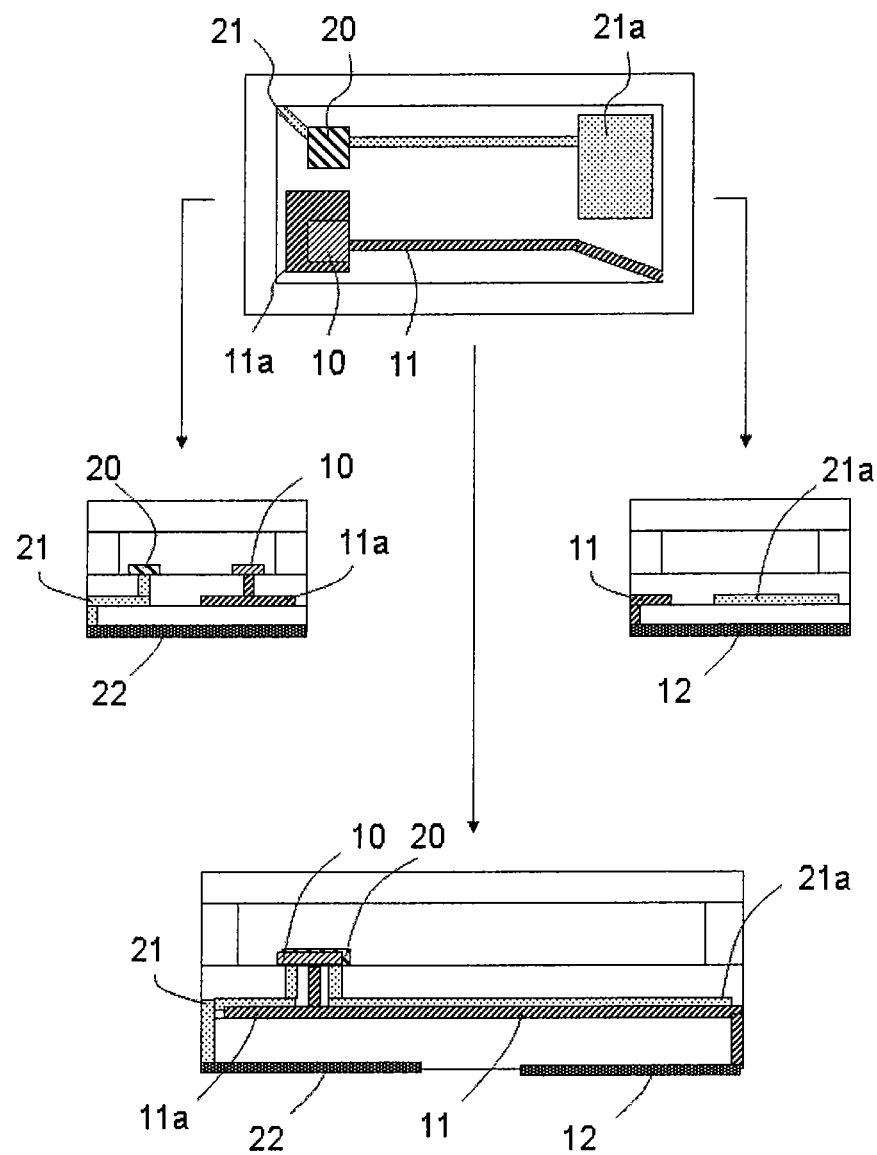
FIG. 13 is a schematic structural view of the piezoelectric vibrator according to the fourth embodiment.

Note that the state in which the extended portions 11a and 21a of the electrode patterns 11 and 21 face the external electrodes 12 and 22 is more apparent when viewing FIG. 13. More specifically, as shown in FIG. 13, the extended portion 11a of the electrode pattern 11 that corresponds to one of the polarities faces the external electrode 22 that corresponds to the other polarity. Further, the extended portion 21a of the electrode pattern 21 that corresponds to the other polarity faces the external electrode 12 that corresponds to the one polarity.

As described above, with the piezoelectric vibrator according to the present embodiment, even when a ceramic multilayer substrate is used, it is possible to provide a piezoelectric vibrator, an oscillator, an electronic device and a radio timepiece that are capable of increasing the capacitance C0 while achieving miniaturization and cost reduction.

What is claimed is:

1. A piezoelectric vibrator, comprising:
   a base substrate;
   a lid substrate that is joined to the base substrate in a state in which the lid substrate faces the base substrate;

a piezoelectric vibrating reed which is housed in a recessed portion formed between the base substrate and the lid substrate, and on which an excitation electrode is formed;
external electrodes formed on an outer surface of the base substrate;
electrode pattern that electrically connect the piezoelectric vibrating reed and the external electrode;
wherein
the external electrodes and the electrode patterns are provided corresponding to respective electrical polarities,
the electrode patterns have mount electrode portion and routing electrode portion respectively,
the routing electrode portion corresponding to one of the polarities and the routing electrode portion corresponding to the other of the polarities face each other on an inner surface side of the base substrate, and
the routing electrode portion for capacitance adjustment that extends along the routing electrode portion corresponding to the one of the polarities is extended from the mounted portion corresponding to the other of the polarities such that routing electrode portion corresponding to the one of the polarities and the routing electrode portion corresponding to the other of the polarities face each other.

2. A piezoelectric vibrator, comprising:
a base substrate;
a lid substrate that is joined to the base substrate in a state in which the lid substrate faces the base substrate;
a piezoelectric vibrating reed which is housed in a recessed portion formed between the base substrate and the lid substrate, and on which an excitation electrode is formed;
external electrodes formed on an outer surface of the base substrate;
electrode pattern that electrically connect the piezoelectric vibrating reed and the external electrode;
wherein
the external electrodes and the electrode patterns are provided corresponding to respective electrical polarities, and
the electrode patterns have a mount electrode portion and a routing electrode portion respectively, and
the routing electrode portion corresponding to one of the polarities and the external electrode corresponding to the other of the polarities face each other in a thickness direction of the base substrate.

3. The piezoelectric vibrator according to claim 1, wherein
a first overlapping electrode portion that extends from the mount electrode portion corresponding to the one of the polarities and a second overlapping electrode portion that extends from the mount electrode portion corresponding to the other of the polarities face each other with a dielectric substance interposed between the first and the second overlapping electrode portions.

4. The piezoelectric vibrator according to claim 2, wherein
the routing electrode portion corresponding to the one of the polarities is formed on an inner surface side of the base substrate such that the electrode pattern extends to a region facing the external electrode corresponding to the other of the polarities.

5. The piezoelectric vibrator according to claim 2, wherein
the base substrate is a ceramic multilayer substrate that is formed by stacking a plurality of ceramic sheets in a thickness direction, and
an extended portion for facing the external electrode is formed on at least one of the plurality of ceramic sheets, from the routing electrode portion corresponding to the one of the polarities, such that the extended portion faces the external electrode corresponding to the other of the polarities.

6. The piezoelectric vibrator according to claim 1, wherein
the lid substrate is a substrate made of a glass material and a weight metal film for frequency adjustment is formed on a tip end of the piezoelectric vibrating reed, and
the electrode patterns are not formed in a vicinity of the tip end of the piezoelectric vibrating reed, on the inner surface side of the base substrate.

7. An oscillator, wherein
the piezoelectric vibrator according to claim 1 is electrically mounted on an integrated circuit, as an oscillation element.

8. An electronic device, wherein
the piezoelectric vibrator according to claim 1 is electrically mounted on a time measuring portion.

9. A radio timepiece, wherein
the piezoelectric vibrator according to claim 1 is electrically connected to a filter portion.

* * * * *